(12) United States Patent
Asano

(10) Patent No.: US 7,199,407 B2
(45) Date of Patent: Apr. 3, 2007

(54) SEMICONDUCTOR DEVICE

(75) Inventor: Tetsuro Asano, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/150,491

(22) Filed: Jun. 13, 2005

(65) Prior Publication Data

US 2005/0285143 A1 Dec. 29, 2005

(30) Foreign Application Priority Data

Jun. 14, 2004 (JP) ............... 2004-175699

(51) Int. Cl.
*H01L 31/00* (2006.01)
(52) U.S. Cl. ............... 257/192; 257/E23.039; 257/545
(58) Field of Classification Search ............ 257/192, 257/225, E23.039, 501, 503, 504, 506, 544, 257/545
See application file for complete search history.

(56) References Cited

U.S. PATENT DOCUMENTS

| | | | |
|---|---|---|---|
| 4,707,719 A | 11/1987 | Whight | |
| 5,510,634 A | 4/1996 | Okabe et al. | |
| 6,495,866 B2 | 12/2002 | Kawamoto | |
| 6,828,645 B2 | 12/2004 | Jimbo | |
| 6,870,201 B1 | 3/2005 | Deboy et al. | |
| 2002/0030199 A1 | 3/2002 | Hirano et al. | |
| 2002/0047177 A1* | 4/2002 | Asano et al. ............... 257/459 |
| 2002/0050603 A1 | 5/2002 | Kawamoto | |
| 2002/0140024 A1* | 10/2002 | Aoki et al. ............... 257/327 |
| 2002/0171093 A1 | 11/2002 | Onishi et al. | |
| 2002/0195613 A1 | 12/2002 | Andoh et al. | |
| 2003/0025154 A1 | 2/2003 | Haynie | |
| 2003/0067033 A1 | 4/2003 | Kinoshita et al. | |
| 2003/0222327 A1 | 12/2003 | Yamaguchi et al. | |
| 2004/0065921 A1 | 4/2004 | Iwamoto et al. | |
| 2004/0077305 A1 | 4/2004 | Andoh et al. | |
| 2005/0056912 A1 | 3/2005 | Ninomiya et al. | |
| 2005/0098826 A1 | 5/2005 | Yamaguchi et al. | |
| 2005/0242411 A1 | 11/2005 | Tso | |

FOREIGN PATENT DOCUMENTS

| | | |
|---|---|---|
| JP | 09-181642 | 7/1997 |
| JP | 2002-368194 | 12/2002 |
| JP | 2004-134589 A | 4/2004 |
| JP | 2004-254086 | 9/2004 |
| KR | 10-0589094 B1 | 6/2006 |

OTHER PUBLICATIONS

WordNet 2.0, 2003 Princeton University. (from http://dictionary.reference.com).*

* cited by examiner

*Primary Examiner*—N. Drew Richards
(74) *Attorney, Agent, or Firm*—Morrison & Foerster LLP

(57) ABSTRACT

An island-shaped floating conducting region is provided in a region of the substrate between the adjacent wires on the nitride film, between the adjacent wire on the nitride film and conducting region (the operating region, resistor, or peripheral impurity region), or between the adjacent wire on the nitride film and gate metal layer. The floating conducting region has floating potential and blocks a depletion layer extending from the wire on the nitride film to the substrate. It is therefore possible to prevent leakage of a high frequency signal to the other side through the depletion layer extending from the wire on the substrate to the substrate in a region of the substrate between the adjacent wires on the nitride film, between the adjacent wire on the nitride film and conducting region (the operating region, resistor, peripheral impurity region), or between the adjacent wire on the nitride film and gate metal layer.

24 Claims, 17 Drawing Sheets

SEMICONDUCTOR DEVICE

BACKGROUND OF THE INVENTION

1. Field of the Invention

The present invention relates to a semiconductor device, and specifically, relates to a semiconductor device with reduced insertion loss.

2. Description of the Related Art

In mobile communication devices such as cellular phones microwaves in the GHz range are often used and switching devices to switch high frequency signals in circuits to switch antennas, transmitting/receiving, or the like are used in many cases (for example, Japanese Patent Application Publication No. 9-181642). In the switching device, a field-effect transistor (hereinafter, referred to as an FET) using gallium arsenide (GaAs) is used in many cases because the device deals with microwaves. Accordingly, a monolithic microwave integrated circuit (MMIC) in which the above switch circuit is integrated has been developed.

For example, the MMIC is a compound semiconductor circuit device called a single pole double throw (SPDT), in which a plurality of stages of FETs are connected in series to achieve high power. Relevant technologies are described in, for example, Japanese Patent Application Publication No. 2004-254086.

SUMMARY OF THE INVENTION

The invention provides a semiconductor device that includes a compound semiconductor substrate, an insulating film disposed on the substrate, a metal layer disposed on the insulating film, a conducting portion disposed in or on the substrate, and a floating conducting region disposed in or on the substrate The floating conducting region is configured not to receive any electric potential, and at least part of the floating region is disposed between the metal layer and the conducting portion.

BRIEF DESCRIPTION OF THE INVENTION

DETAILED DESCRIPTION OF THE PREFERRED EMBODIMENTS

Figure 16:
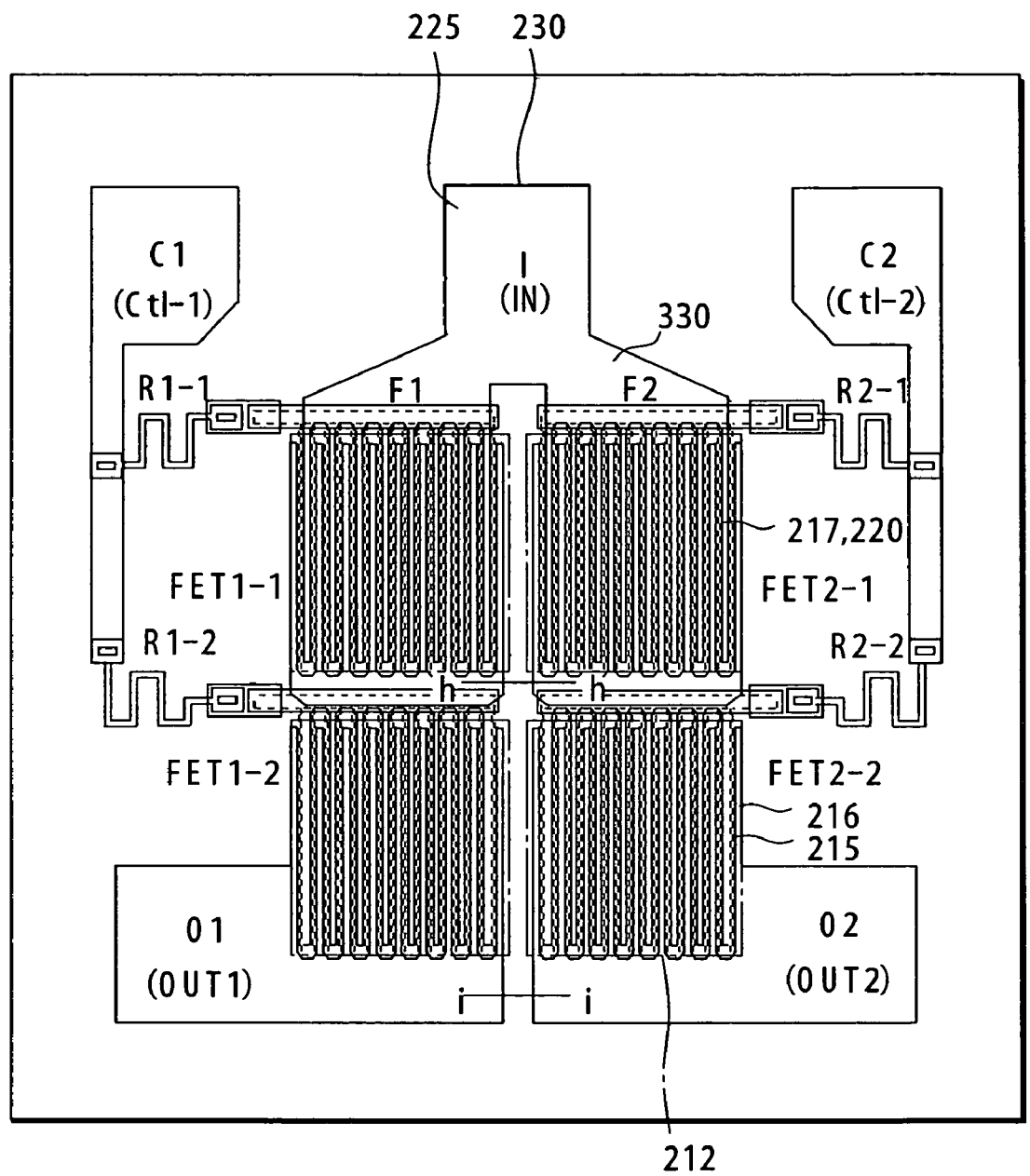
FIG. 16 is a plan view for explaining a conventional art.

FIG. 16 is a plan view showing an example of a multistage connection compound semiconductor switching circuit device that forms a basis of one of the embodiments of the invention.

The circuit device is a SPDT, in which a plurality of stages of FETs are connected in series to achieve high power.

On a GaAs substrate, two FET groups F1 and F2 for switching are arranged. The FET group F1 includes, for example, FET1-1 and FET1-2 connected in series. The FET group F2 includes FET2-1 and FET2-2 connected in series. Four gate electrodes constituting the FET groups 1 and 2 are connected to resistors R1-1, R1-2, R2-1, and R2-2 each formed of a conducting region. Electrode pads I, O1, O2, C1, and C2, which correspond to a common input terminal IN, output terminals OUT1 and OUT2, and control terminals Ctl-1 and Ctl-2, respectively, are provided in the periphery of the substrate. A second metal layer indicated by dotted lines is a gate metal layer (Ti/Pt/Au) 220 formed simultaneously with formation of the gate electrodes of the FETs. A third metal layer indicated by solid lines is a pad metal layer (Ti/Pt/Au) 225 for connecting the elements and forming the pads. A first metal layer is an ohmic metal layer (AuGe/Ni/Au) ohmically connected to the substrate, which forms the source and drain electrode of each FET and extraction electrodes at both ends of each resistor. The ohmic layer is overlapped by the pad metal layer and is not shown in FIG. 16.

The FET groups F1 and F2 are arranged symmetrically with respect to the centerline of the chip and have a same constitution. The following description is then provided for the FET group F1. In the FET1-1, a source electrode 215 (or a drain electrode 216) includes eight comb teeth of the pad metal layer 225, the teeth extending from the upper side, and are connected to the common input terminal pad I. The source electrode (or the drain electrode) formed of the ohmic metal layer is provided thereunder. The drain electrode 216 (or the source electrode 215) of the FET1-1 includes nine comb teeth of the pad metal layer 225, the teeth extending from the lower side, and the drain electrode (or the source electrode) formed of the ohmic metal layer is provided thereunder. These source and drain electrodes are arranged in a form of engaged comb teeth. A gate electrode 217 formed of the gate metal layer 220 includes 16 comb teeth each arranged between a pair of adjacent teeth of the source and drain electrodes.

In the FET1-2, the source electrode 215 (or the drain electrode 216) includes eight comb teeth of the pad metal layer 225, the teeth extending from the upper side, and the source electrode (or the drain electrode) formed of the ohmic metal layer is provided thereunder. The drain electrode 216 (or the source electrode 215) includes nine comb teeth of the pad metal layer 225, extending from the lower side, and is connected to the output terminal pad O1. The drain electrode (or the source electrode) formed of the ohmic metal layer is provided thereunder. These source and drain electrodes are arranged in a form of engaged comb teeth. The gate electrode 217 formed of the gate metal layer 220 includes 16 comb teeth each arranged between a pair of adjacent teeth of the source and drain electrodes.

Each of operating regions 212 is a conducting region provided in a region indicated by a dashed-dotted line and includes source and drain regions made of high concentration impurity regions. The source and drain regions are connected to the source and drain electrodes 215 and 216, respectively. Each of the gate electrodes 217 is in Schottky junction with a part of the operating region 212 (for example, see FIG. 11 in the Japanese Patent Application Publication No. 2004-254086).

Figure 17:
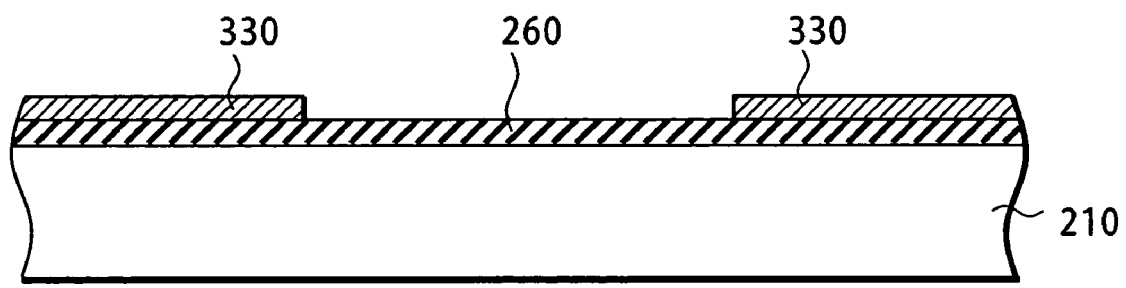
FIG. 17 is a cross-sectional view for explaining the conventional art.

FIG. 17 shows a cross-sectional view taken along a line h—h of FIG. 16 (similar along a line i—i). In these regions, wires 330 of the pad metal layer 225 are arranged on a nitride film 260 as shown in the drawing. In other words, it is generally assumed that the wires 330 through which a high frequency signal is transmitted are insulated from a semi-insulating substrate 210 with the nitride film 260.

However, it was found that leakage of the high frequency signal was caused in such a pattern, thus increasing an insertion loss of the switching circuit device and reducing isolation.

This is because, when the high frequency signal is transmitted in the pad metal layer 225 (the wires 330), the nitride film 260 serves as a capacitor, and the high frequency signal passes through the nitride film 260. In other words, when the high frequency signal reaches the semi-insulating substrate 210, a depletion layer is accordingly generated within the substrate 210, and the high frequency signal reaches a wire or an element (FET operating region) adjacent thereto, thus causing reduction in isolation and an increase in insertion loss.

The following embodiments of the invention are directed to solving these problems.

A description is given of embodiments of the present invention with reference to FIGS. 1 to 15B.

Figure 1:
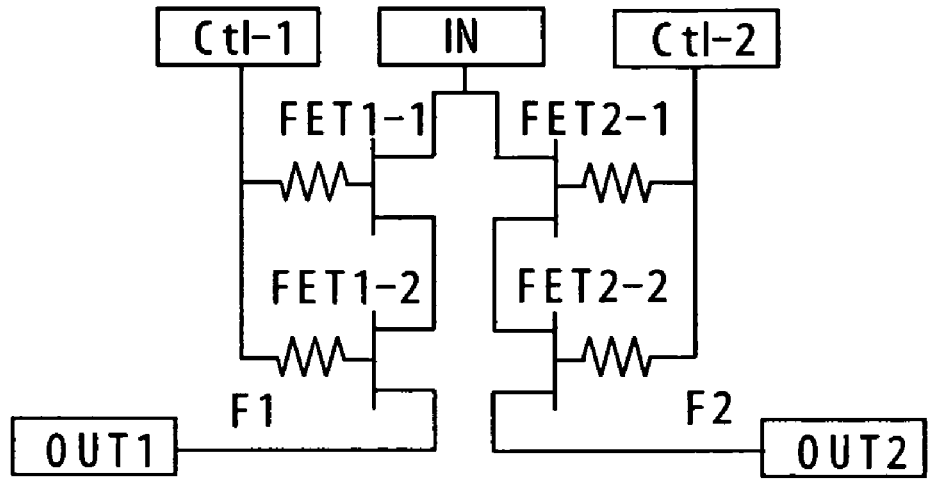
FIG. 1 is a circuit diagram of a preferred embodiment of the present invention.
Figure 2:
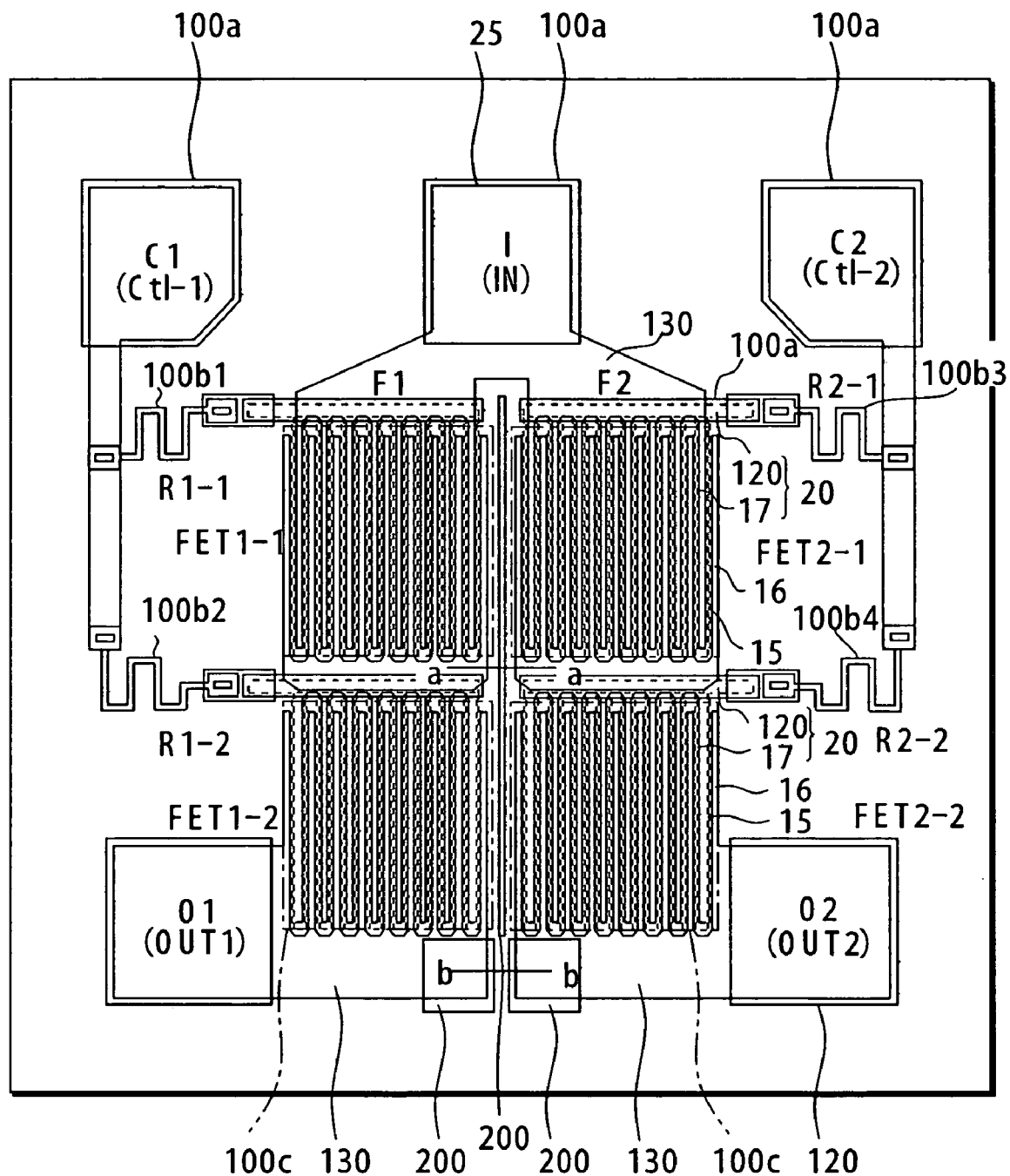
FIG. 2 is a plan view of a preferred embodiment of the present invention.

First, with reference to FIGS. 1 and 2, a description is given of an example of a switching circuit device for high-power use including a plurality of FETs connected in series, which is preferred for the first embodiment of the present invention.

FIG. 1 is a circuit diagram showing an example of a compound semiconductor multistage switching circuit device. This switching circuit device is called an SPDT and includes five external terminals which are a common input terminal IN, first and second output terminals OUT1 and OUT2, and first and second control terminals Ctl-1 and Ctl-2.

As shown in the drawing, the switching circuit device includes first and second FET groups F1 and F2, each of which includes, for example, two FETs connected in series. A source electrode (or a drain electrode) of the FET1-1 of the first FET group F1 and a source electrode (or a drain electrode) of the FET2-1 of the second FET group F2 are connected to the common input terminal IN. Gate electrodes of the two FETs of the first FET group F1 are connected to the first control terminal Ctl-1 through respective resistors, and gate electrodes of the two FETs of the second FET group F2 are connected to the second control terminal Ctl-2 through respective resistors.

Furthermore, a drain electrode (or a source electrode) of the FET1-2 of the first FET group F1 is connected to the first output terminal OUT1, and a drain electrode (or a source electrode) of the FET2-2 of the second FET group F2 is connected to the second output terminal OUT2.

Control signals applied to the first and second control terminals Ctl-1 and Ctl-2 are complementary signals. The FET group to which an H-level signal is applied is turned on and transmits an input signal entered to the common input terminal IN to any one of the output terminals. The resistors are placed for the purpose of preventing leakage of a high frequency signal through the gate electrodes to DC potential of the control terminals Ctl-1 and Ctl-2, which are AC grounded.

FIG. 2 shows an example of a compound semiconductor chip obtained by integrating this compound semiconductor switching circuit device.

The two FET groups F1 and F2 for switching are arranged in a GaAs substrate. The FET group F1 includes, for example, the FET1-1 and the FET1-2 connected in series. The FET group F2 includes the FET2-1 and the FET2-2 connected in series. Four gate electrodes constituting the FET groups are connected to resistors R1-1, R1-2, R2-1, and R2-2, each composed of an conducting region, respectively. Electrode pads I, O1, O2, C1, and C2, which correspond to the common input terminal IN, the first and second output terminals OUT1 and OUT2, and the first and second control terminals Ctl-1 and Ctl-2, respectively, are provided in the periphery of the substrate. A second metal layer indicated by dotted lines is a gate metal layer (Pt/Mo) 20 formed simultaneously with formation of the gate electrodes of the FETs. A third metal layer indicated by solid lines is a pad metal layer (Ti/Pt/Au) 25 for connecting the elements and forming the pads. A first metal layer is an ohmic metal layer (AuGe/Ni/Au) ohmically connected to the substrate, which forms source and drain electrodes of each FET and extraction electrodes at both ends of each resistor. The ohmic metal layer is overlapped by the pad metal layer and is not shown in FIG. 2.

The FET groups F1 and F2 are arranged symmetrically with respect to the centerline of the chip and have a same constitution. The following description is then provided for the FET group F1.

Each of operating regions 100c is a rectangular region of the GaAs substrate surrounded by a dashed dotted line, into which n-type impurity ions are implanted. In each of the operating regions 100c, source and drain regions are selectively formed of high concentration n-type impurity regions.

In the FET1-1, a source electrode 15 (or a drain electrode 16) includes eight comb teeth of the pad metal layer 25, the teeth extending from the upper side, and is connected to the common input terminal pad I. The not-shown source electrode (or the drain electrode) formed of the ohmic metal layer is provided thereunder. The drain electrode 16 (or the source electrode 15) of the FET1-1 includes nine comb teeth of the pad metal layer 25, the teeth extending from the lower side. The not-shown drain electrode (or the source electrode) formed of the ohmic metal layer is ohmically connected to a drain region (a source region) of the operating region 100c thereunder. The source and drain electrodes 15 and 16 are arranged in a form of engaged comb teeth, and a gate electrode 17 includes 16 comb teeth formed of the gate metal layer 20 each arranged between a pair of adjacent teeth of the drain and source electrodes 15 and 16. The gate electrode 17 forms Schottky junction with a part of the operating region 100c between the source and drain regions.

In the FET1-2, the source electrode 15 (or the drain electrode 16) includes eight comb teeth of the pad metal layer 25, the teeth extending from the upper side. The source electrode (or the drain electrode) formed of the ohmic metal layer is provided thereunder. The drain electrode 16 (or the source electrode 15) includes nine comb teeth of the pad metal layer 25, the teeth extending from the lower side, and is connected to the output terminal pad O1. The drain electrode (or the source electrode) formed of the ohmic metal layer is provided thereunder. The source and drain electrodes 15 and 16 are arranged in a form of engaged comb teeth, and the gate electrode 17 formed of the gate metal layer 20 includes 16 comb teeth each arranged between a pair of adjacent teeth of the drain and source electrodes. The gate electrode 17 has Pt buried to achieve a FET with higher breakdown voltage and lower on-resistance than those of an FET including a Ti/Pt/At gate electrode.

In the FET1-1, the comb teeth of the gate electrode 17 are joined to each other with a gate wire 120 outside the operating region 100c and connected to the first control terminal pad C1 through the gate wire 120 and the resistor R1-1. In the FET1-2, the comb teeth of the gate electrode 17 are similarly joined to each other with the gate wire 120 and connected to the first control terminal pad C1 through the gate wire 120 and the resistor R1-2.

The resistors R1-1 and R1-2 are formed by conducting regions 100b1 and 100b2, respectively, where an impurity is implanted into the substrate. The resistors R1-1 and R1-2 connect the gate electrodes 17 on the operating region 100c with the first control terminal pad C1. The resistors R2-1 and R2-2 of the FET group F2 are formed by conducting regions 100b3 and 100b4, respectively.

Furthermore, in the peripheries of each of the pads (I, O1, O2, C1 and C2) and gate wires 120, peripheral impurity regions 100a, which are high concentration impurity regions, are arranged to improve isolation. Each of the peripheral impurity regions 100a is directly connected to the corresponding pad and provided in the whole area (or in the periphery of the pad) under the pad so as to protrude from the pad. In another case the peripheral impurity regions 100a may be provided about 5 μm or less apart from the respective pads in the periphery thereof and are connected in direct current mode to the respective pads with the semi-insulating substrate interposed therebetween. Moreover, the gate wires 120 are connected in direct current mode to the respective peripheral impurity regions 100a. In this manner, the peripheral impurity regions 100a are not connected in only alternating current mode with the nitride film or the like interposed therebetween, but also connected in direct current mode to each of the pads or gate wires 120 without the nitride film or the like interposed therebetween. The peripheral impurity regions 100a are connected in direct current mode to the operating region 100c.

Conducting regions 200 at floating potential are provided such that at least each part of the conducting regions 200 is provided in the surface of a substrate 10 between metal layers arranged on the insulating film, between a metal layer on the insulating film and another metal layer connected in direct current mode to the operating region 100c, or between a metal layer on the insulating film and any conducting region.

The metal layer on the insulating film indicates a wire or each of the pads, and the wire is a wire 130 of the pad metal layer 25.

Aforementioned another metal layer indicates the another wire 130 on the insulating film or metal layers (the gate wires 120, the gate electrodes 17) forming Schottky junction with the substrate.

In this specification, the conducting regions of the GaAs substrate indicate all regions of the GaAs substrate into which impurity ions are implanted. Accordingly, regions other than the conducting regions are parts of the semi-insulating substrate.

The conducting regions include the conducting regions 100 and the conducting regions 200 (hereinafter, referred to as floating conducting regions 200) at floating potential. The conducting regions 100 include the operating regions 100c and the conducting regions connected in direct current mode to the operating regions 100c. The conducting regions connected in direct current mode to the operating regions 100c include the peripheral impurity regions 100a of the pads (or gate wires 120) and resistors 100b, which are the conducting regions other than the operating regions 100c. Each of the floating conducting regions 200 is a high concentration (about 1 to $5 \times 10^{18}$ cm$^{-3}$) impurity region which is provided in island shape and has floating potential. No potential is externally applied to the floating conducting region 200.

The floating conducting regions 200 are, specifically, arranged in the surface of the substrate between adjacent metal layers on the insulating film, between the metal layers on the insulating film and the gate wires 120, between the metal layers on the insulating film and the gate electrodes 17, between the metal layers on the insulating film and the peripheral impurity regions 100a, between the metal layers on the insulating film and the resistors 100b, and between the metal layers on the insulating film and the operating regions 100c.

First, in the first embodiment, the floating conducting region 200 is arranged in the surface of the substrate between adjacent wires, for example, between the first FET group F1 and the second FET group F2.

Figure 3A:
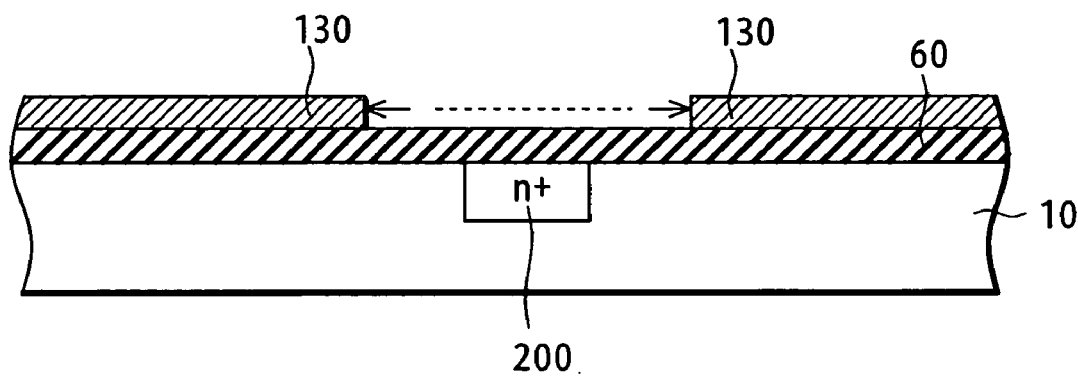
FIGS. 3A and 3B are cross-sectional views of a preferred embodiment of the present invention.
Figure 3B:
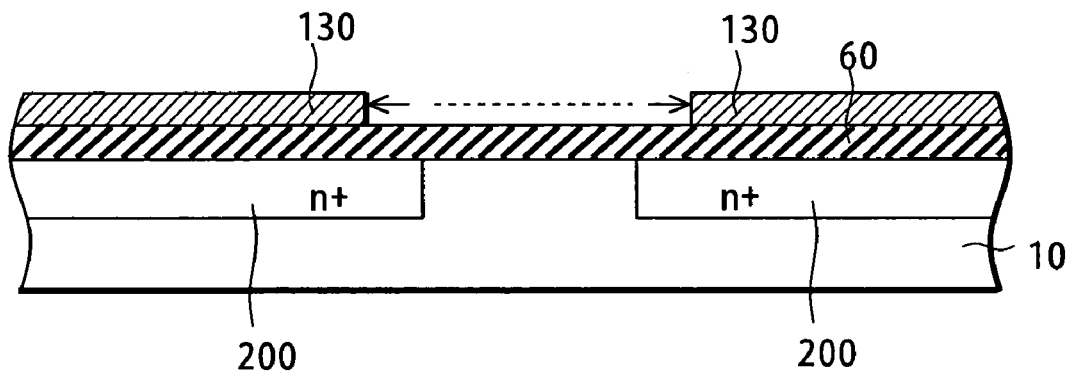

The first embodiment is described in detail with reference to FIGS. 3A and 3B. FIGS. 3A and 3B are cross-sectional views taken along lines a—a and b—b of FIG. 2, respectively.

As shown in FIG. 3A, in a region in which FETs are connected in series, the wires 130 of the pad metal layer 25 are extended on a nitride film 60 provided on the surface of a substrate 10. Specifically, the wire 130 of the FET group F1 is arranged close to the other wire 130 connected to an operating region 100c of the second FET group F2 and extended on the nitride film 60.

In this embodiment, the floating conducting region 200 is provided in the surface of the substrate 10 between the wires 130 (indicated by a dashed arrow) which are arranged on the nitride film 60 adjacent to each other in this manner.

The floating conducting region 200 is spaced from each of the wires 130 by such a distance (for example, about 4 μm) that a predetermined isolation is ensured between the wires 130 adjacent to each other with the floating conducting region 200 interposed therebetween. The isolation required for the compound semiconductor switching circuit device, for example, is not less than 20 dB. It has been already known experimentally that the distance of at least 4 μm between the adjacent high concentration impurity regions can ensure an isolation of not less than 20 dB. Between the adjacent metal layers connected to the substrate, in which interference is most likely to occur, the distance therebetween of at least 20 μm can ensure an isolation of not less than 20 dB. In the pattern of this embodiment including adjacent the wires 130 on the nitride film 60, for example, the floating conducting region 200 with a width of 2 μm is arranged 4 μm apart from the wire 130, and the other wire 130 is arranged 4 μm apart from the floating conducting region 200. A small leakage of a high frequency signal between the wires 130 can be therefore prevented, thus preventing an increase in insertion loss.

When a high frequency analog signal is transmitted in the wires 130, the nitride film 60 serves as a capacitor, and the high frequency signal passes through the nitride film 60. However, in this embodiment, even when the high frequency signal reaches the semi-insulating substrate 10 and the depletion layer expands within the substrate, the expansion of the depletion layer can be prevented by the floating conducting region 200.

In other words, it is possible to ensure adequate isolation and suppress the increase in insertion loss.

As shown in FIG. 3B, in a region where corner portions of the wires 130 are adjacent to each other, the floating conducting regions 200 should be provided under the respective wires 130 such that at least a part of the floating conducting regions 200 is arranged in the surface of the substrate between the adjacent wires 130 (shown by a dashed arrow). The floating conducting regions 200 are arranged in island shape so as to protrude from the respective wires 130 (see FIG. 2).

This enables blocking the expansion of not only the depletion layer between the first FET group F1 and the second FET group F2 but also the depletion layers expanding from the wires 130 towards the edge of the chip (the chip bottom side in FIG. 2). In this case, it is enough if the floating conducting regions 200 protrude from the respective wires 130 by about 2 μm.

The floating conducting regions 200 can be formed in a step of implantation of n+ type impurity ions to form the source and drain regions, resistors, or the like constituting the switching circuit and have an advantage in that the floating conducting regions 200 can be formed without any special step added.

Figure 4A:
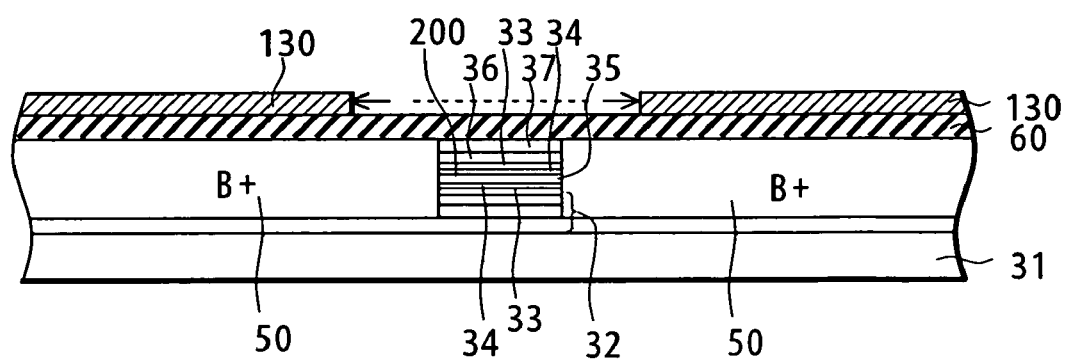
FIGS. 4A and 4B are cross-sectional views of a preferred embodiment of the present invention.
Figure 4B:
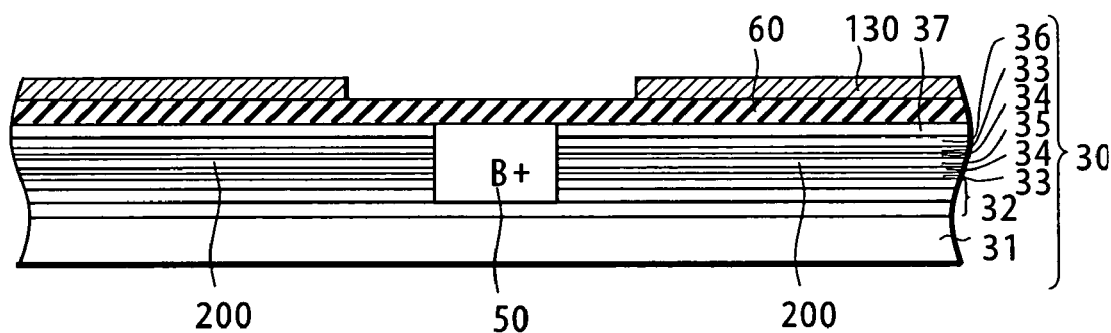

Next, a description is given of the second embodiment of the present invention with reference to FIGS. 4A and 4B.

The second embodiment is the case where the base device is an HEMT (High Electron Mobility Transistor) and has a same pattern as the case of the GaAs FET shown in the first embodiment. The plan view thereof is the same as FIG. 2, and the description thereof is omitted. The description is given with reference to cross-sectional views of FIGS. 4A and 4B. FIGS. 4A and 4B are cross sectional views taken along lines a—a and b—b of FIG. 2, respectively.

An HEMT substrate 30 is formed by disposing an undoped buffer layer 32 on a semi-insulating GaAs substrate 31. The buffer layer 32 is often composed of a plurality of layers. On the buffer layer 32, an n+ type AlGaAs layer 33 as an electron supply layer, an undoped InGaAs layer 35 as a channel (electron transit) layer, the n+ type AlGaAs layer 33 as the electron supply layer are sequentially stacked. Between the electron supply layer 33 and the channel layer 35, a spacer layer 34 is arranged.

On the electron supply layer 33, an undoped AlGaAs layer 36 as a barrier layer is disposed to ensure predetermined breakdown voltage and pinch-off voltage. Furthermore, an n+ type GaAs layer 37 as a cap layer is disposed as the topmost layer. The cap layer 37 is connected to the metal layers including pads; source electrodes, drain electrodes, or extraction electrodes of resistors. Setting high impurity concentration (about 1 to $5 \times 10^{18}$ cm$^{-3}$) reduces source resistance and drain resistance, thus improving ohmic property.

In the HEMT, electrons generated from the donor impurity of the n+ type AlGaAs layer 33 as the electron supply layer move to the channel layer 35 side, thus forming a channel serving as a current path. The electrons and donor ions are spatially separated by a heterojunction interface. The electrons move in the channel layer 35, which does not include donor ions causing reduction in electron mobility. Accordingly, the electrons are little affected by Coulomb scattering, and the channel layer 35 can achieve high electron mobility.

In the HEMT, a necessary pattern is formed by isolating the substrate with insulating regions 50 which are selectively formed on the substrate. Herein, the insulating regions 50 are not completely electrically insulators but are insulated by implanting impurity ions (B+) to provide a carrier trap level in epitaxial layers. For example, the operating regions 100c are formed by isolating the regions indicated by the dashed-dotted lines of FIG. 2 with the insulating regions 50.

Referring to FIG. 2, a part of the cap layer 37 of the substrate to be a source region (or a drain region) within each operating region 100c is connected to a source electrode (or a drain electrode) formed of an ohmic metal layer as the first metal layer. A source electrode 15 (or a drain electrode 16) of a pad metal layer 25 is formed thereon.

The cap layer 37 is etched in a part of each operating region 100c, that is, between the source and drain regions, and a gate electrode 17 formed of a gate metal layer 20 as a second metal layer is arranged on an exposed part of the undoped AlGaAs layer 36.

Moreover, a peripheral impurity regions 100a of each of the pads (I, O1, O2, C1 and C2) or gate wires 120 and resistors 100b1 to 100b4 are formed by being isolated by the insulating regions 50.

In the second embodiment, as shown in FIG. 4A, a floating conducting region 200 is arranged in the substrate between adjacent wires 130 on a nitride film 60.

In this specification, the conducting regions of the HEMT indicate all the regions not insulated by implantation of B+. The each insulating region 50 includes an impurity as an epitaxial layer, but the impurity is inactivated by the implantation of B+ for insulation. In this specification, the regions which are not insulated by the implantation of B+ correspond to the conducting regions by ion implantation in the first embodiment. In other words, the insulating regions 50 are not the conducting regions.

The conducting regions isolated by the insulating regions 50 include conducting regions 100 and the floating conducting regions 200. The conducting regions 100 include the operating regions 100c and conducting regions connected in direct current mode to the operating regions 100c. The conducting regions connected in direct current mode to the operating regions 100c include the peripheral impurity regions 100a of each of the pads (or the gate wires) and the resistors 100b. Each of the peripheral impurity regions 100a and the resistors 100b is another conducting region connected in direct current mode to the operating region 100c.

The floating conducting regions 200 are conducting regions at floating potential, to which no potential is applied. The floating conducting region 200 has the same structure as the structure of the epitaxial layer of the HEMT and includes the cap layer 37 (impurity concentration: about 1 to $5 \times 10^{18}$ cm$^{-3}$). In terms of the function, accordingly, the floating conducting regions 200 are the high concentration impurity regions.

Each of the floating conducting regions 200 is spaced from the wires 130 by such a distance (for example, about 4 μm) that a predetermined isolation is ensured between the wires 130 arranged with the floating conducting region 200 interposed therebetween.

Accordingly, even when a high frequency analog signal is transmitted in the wires 130 and passes through the nitride film 60 and depletion layers expand within the substrate, the floating conducting regions 200 can prevent the expansion of the depletion layers.

In other words, it is possible to ensure adequate isolation and suppress the increase in insertion loss.

In the case of the HEMT, particularly, the base device has a smaller insertion loss than that of the GaAs FET. If the path of a high frequency signal within the chip leaks a small amount of a high frequency signal, accordingly, the increase in insertion loss of the switching circuit device becomes noticeable. In addition, the insulating regions 50 are not completely electrically insulator, and a depletion layer expands into the insulating regions 50. The variation in the depletion layer causes signal leakage.

However, according to this embodiment, the floating conducting region 200 with high concentration impurity can prevent the leakage of a high frequency signal from the path of the high frequency signal, thus reducing the insertion loss.

As shown in FIG. 4B, in the region where the corner portions of the wires 130 on the insulating film 60 are adjacent to each other, the floating conducting regions 200 are provided under the respective wires 130 such that at least a part of the floating conducting region 200 is arranged in the surface of the substrate between the adjacent wires 130. In other words, the insulating region 50 is provided in the substrate between the adjacent wires 130, and island-shaped portions of the cap layer 37 are left so as to protrude from the respective wires 130 (see FIG. 2). This enables blocking the expansion of not only the depletion layer between the first FET group F1 and the second FET group F2 but also the depletion layers expanding from the wires 130 towards the edge of the chip (the chip bottom side in FIG. 2).

Furthermore, the floating conducting regions 200 can be formed by the pattern of the insulating regions 50 in the step same as that of forming the operating regions 100c of the HEMTs, the resistors, and the like and can be implemented without adding any special step.

Figure 5:
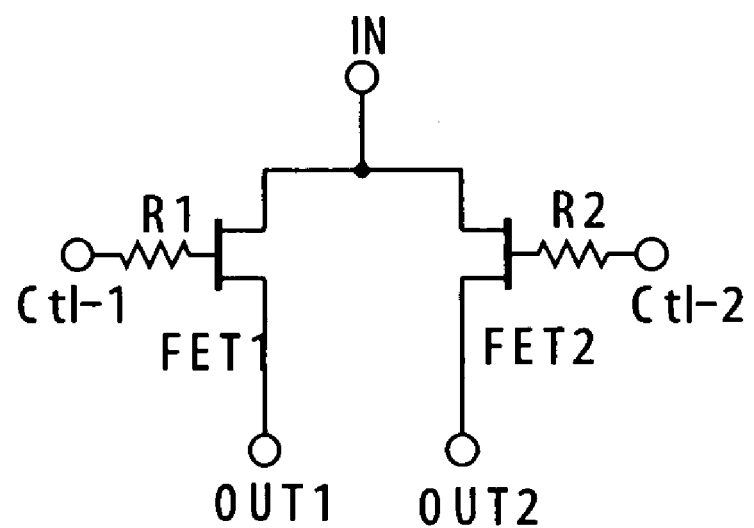
FIG. 5 is a circuit diagram of a preferred embodiment of the present invention.
Figure 6:
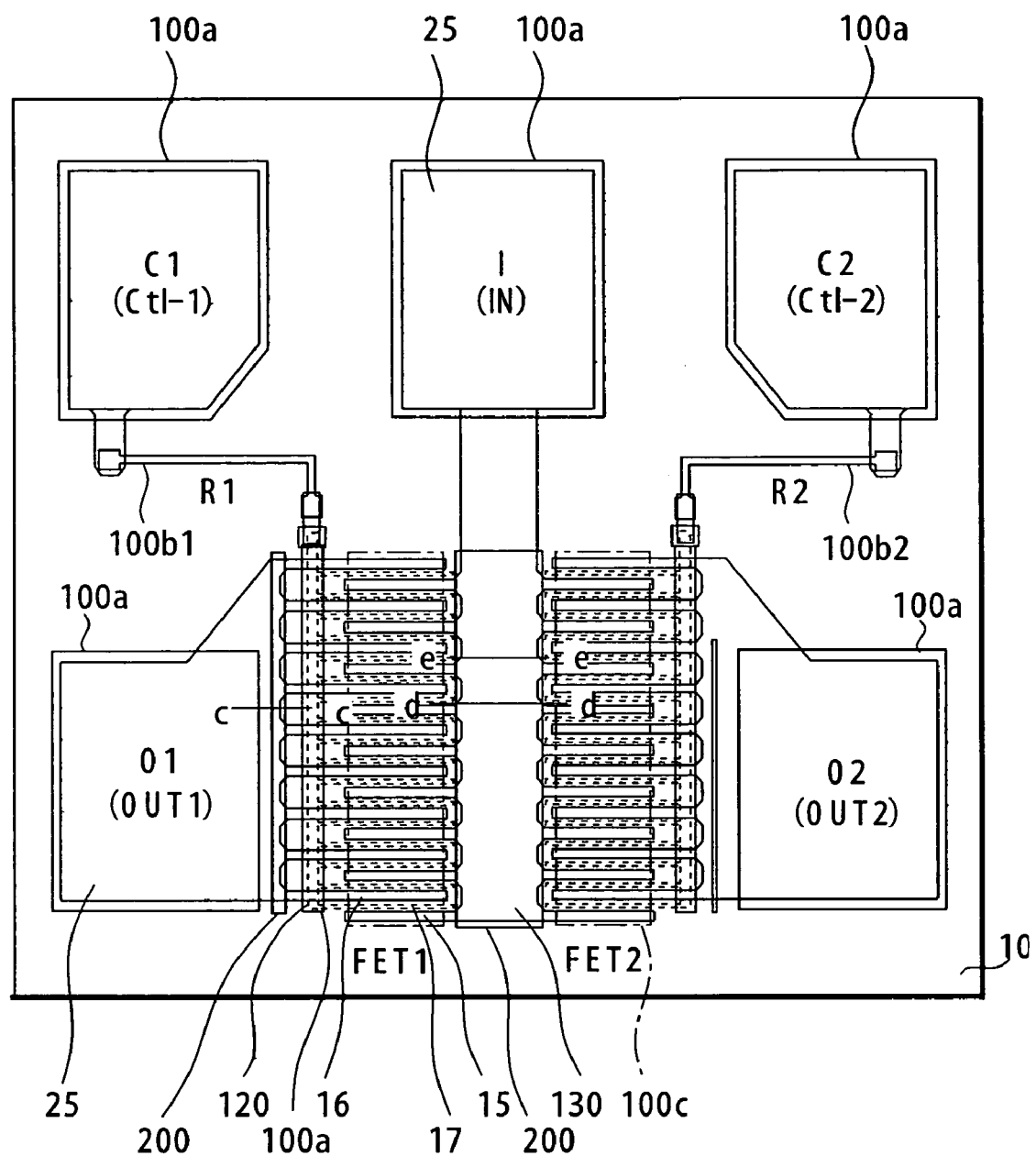
FIG. 6 is a plan view of a preferred embodiment of the present invention.

A description is given of the third embodiment of the present invention with reference to FIG. 5 to FIG. 8B. The third embodiment is another type of the SPDT switching circuit device. FIG. 5 is a schematic circuit diagram, and FIG. 6 shows a switching circuit device obtained by integrating the circuit of FIG. 5 into one chip.

As shown in FIG. 5, the switching circuit device of the third embodiment is a basic SPDT switching circuit device, in which source electrodes (or drain electrodes) of first and second FET1 and FET2 are connected to a common input terminal IN. Moreover, gate electrodes of the FET1 and FET2 are connected to first and second control terminals Ctl-1 and Ctl-2 with resistors R1 and R2 interposed therebetween, respectively. Drain electrodes (or source electrodes) of the FET1 and FET2 are connected to first and second output terminals OUT1 and OUT2.

Control signals applied to the first and second control terminals Ctl-1 and Ctl-2 are complementary signals. The FET to which an H-level signal is applied is turned on and transmits an input signal entered to the common input terminal IN to any one of the output terminals. The resistors R1 and R2 are placed for the purpose of preventing leakage of a high frequency signal through the gate electrodes to DC potentials of the first and second control terminals Ctl-1 and Ctl-2, which are AC grounded.

To transmit a signal to the first output terminal OUT1, for example, 3 V and 0 V are applied to the first and second control terminals Ctl-1 and Ctl-2, respectively. On the contrary, to transmit a signal to the second output terminal OUT2, 3 V and 0 V are applied to the second and first control terminals Ctl-2 and Ctl-1, respectively.

As shown in FIG. 6, the FET1 and FET2 for switching are arranged in the center of a GaAs substrate, and the gate electrodes of the FETs are connected to the resistors R1 and R2. Pads I, O1, O2, C1, and C2, which correspond to the common input terminal IN, the first and second output terminals OUT1 and OUT2, and the first and second control terminals Ctl-1 and Ctl-2, respectively, are provided around the FET1 and FET2 in the periphery of the substrate. A second metal layer indicated by dotted lines is a gate metal layer (Pt/Mo) 20 formed simultaneously with formation of gate electrodes 17 of the FETs. A third metal layer indicated by solid lines is a pad metal layer (Ti/Pt/Au) 25 for connecting the elements and forming the pads. A first metal layer is an ohmic metal layer (AuGe/Ni/Au) forming an ohmic junction with the substrate and constitutes the source and drain electrodes of each FET and extraction electrodes at both end of each resistor. The ohmic layer is overlapped by the pad metal layer and is not shown in the drawing.

The gate electrode 17 of the FET1 is connected to the first control terminal pad C1 through the resistor R1, and the gate electrode 17 of the FET2 is connected to the second control terminal pad C2 through the resistor R2.

In each of the FET1 and FET2, a drain electrode 16 (or a source electrode 15) includes nine comb teeth of the pad metal layer 25, the teeth extending to the center of the chip. The pad metal layer 25 is connected to the first and second output terminal pad O1 and O2 respectively. Under the drain electrode 16 (or the source electrode 15), the drain electrode (or the source electrode) formed of the ohmic metal layer is provided. The source electrode 15 (or the drain electrode 16) includes nine comb teeth formed of the pad metal layer 25 as the third metal layer, the teeth extending outward from the center of the chip. The pad metal layer 25 is connected to the common input terminal pad I. Under the source electrode 15 (the drain electrode 16), the source electrode (or the drain electrode) formed of the ohmic metal layer is provided.

These source and drain electrodes 15 and 16 are arranged in a form of engaged combs, and the gate electrode 17 formed of the gate metal layer 20 includes 17 comb teeth each arranged between a pair of adjacent teeth of the drain and source electrodes 16 and 15.

In the GaAs substrate 10, operating regions 100c into which n-type impurity ions are implanted are provided as indicated by dashed-dotted lines. In each of the operating region 100c, the source and drain regions into which the high concentration (n+) impurity ions are implanted are formed and connected to the source and drain electrodes 15 and 16, respectively. The gate electrode 17 forms a Schottky junction with a part of the operating region 100c between the source and drain regions.

In the FET1, the comb teeth of the gate electrode 17 are joined to each other with a gate wire 120 outside the operating region 100c and connected to the first control terminal pad C1 through the resistor R1. In the FET2, the comb teeth of the gate electrode 17 are similarly joined to each other with a gate wire 120 and connected to the second control terminal pad C2 through the resistor R2. The resistors R1 and R2 are formed by conducting regions of the substrate into which a high concentration n-type impurity is separately implanted.

The gate wires 120 form Schottky junction with the substrate similar to the gate electrodes 17. In the periphery of each of the gate wires 120, a peripheral impurity region 100a connected in direct current mode to the gate wire 120 is arranged. The peripheral impurity region 100a is an conducting region provided in the substrate and directly connected to the gate wire 120. The peripheral impurity region 100a is provided in a whole area (or in the periphery of the gate wire 120) under the gate wire 120 so as to protrude from the gate wire 120. This can suppress expansion of a depletion layer from the gate wire 120 into the substrate and improve the isolation. The peripheral impurity region 100a may be provided in the surface of the substrate of the periphery of the gate wire 120 so as to be spaced about 5 µm or less apart from the gate wire 120 and connected in direct current mode through the semi-insulating substrate. The distance of about 5 µm or less is enough for direct current connection of the gate wire 120 and a peripheral impurity region 100. The peripheral impurity region 100a is connected in direct current mode to the operating region 100c.

Because of the similar reason, also under each of the pads (I, O1, O2, C1 and C2), the peripheral impurity region 100a connected in direct current mode to the pad is arranged. Also in this case, the peripheral impurity region 100a is provided in a whole area (or in the periphery of the pad) under the pad so as to protrude from the pad or provided in the periphery of the pad so as to be spaced about 5 µm or less apart from the pad.

Figure 7A:
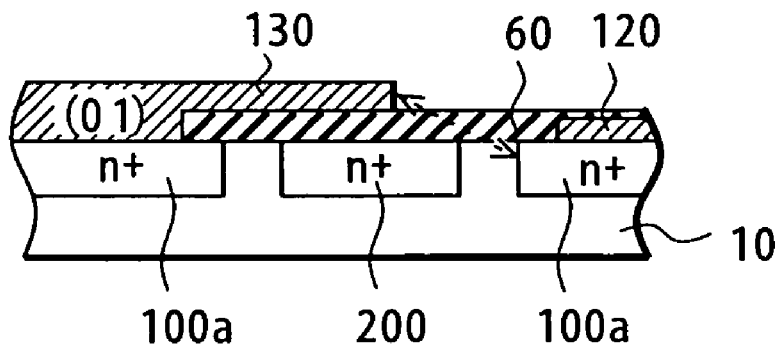
FIGS. 7A to 7C are cross-sectional views of a preferred embodiment of the present invention.
Figure 7B:
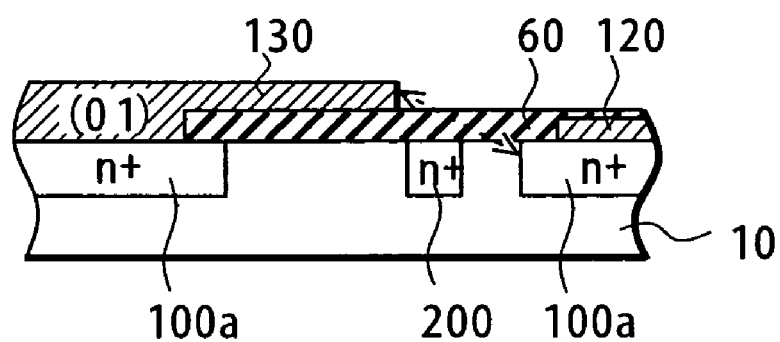
Figure 7C:
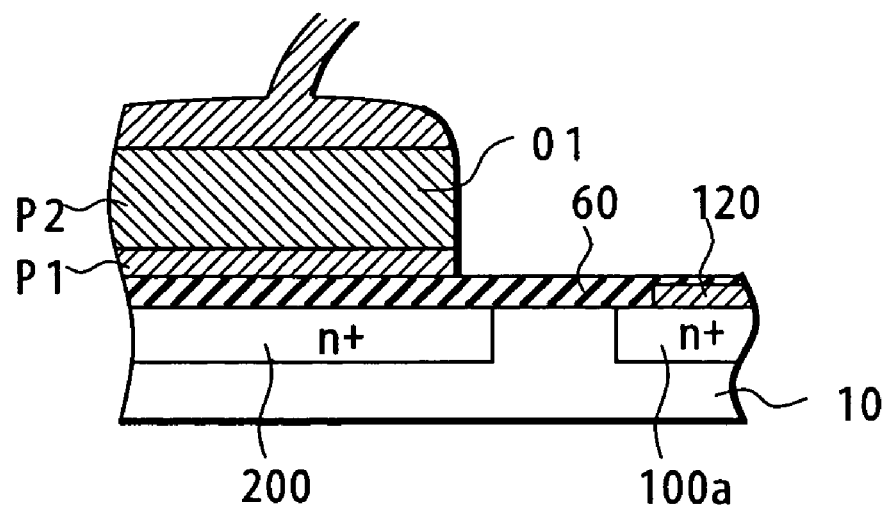
Figure 8A:
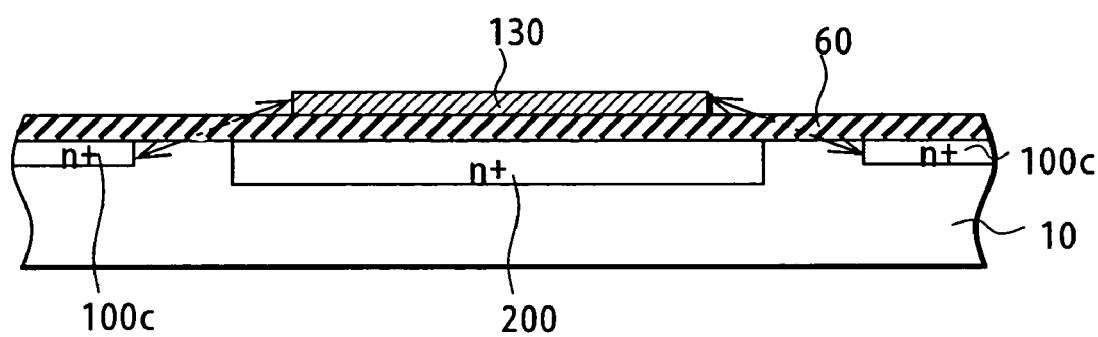
FIGS. 8A and 8B are cross-sectional views of a preferred embodiment of the present invention.
Figure 8B:
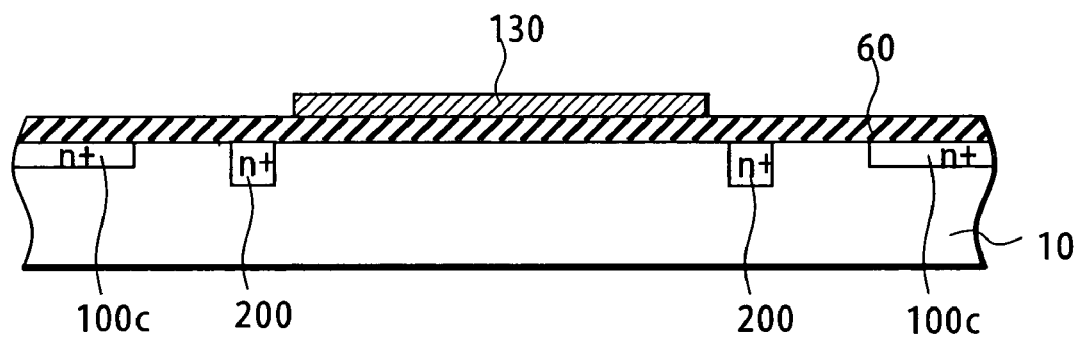

In the third embodiment, as shown in FIGS. 7A to 7C and FIGS. 8A and 8B, the peripheral impurity region 100a provided in the substrate 10 and the metal layer (the wire 130 or pad) on the nitride film 60 are adjacent to each other (see FIGS. 7A to 7C), or the operating regions 100c and the metal layer (the wire 130 or pad) on the nitride film 60 are adjacent to each other (see FIGS. 8A and 8B).

First, FIGS. 7A to 7C show cases where a floating conducting region 200 is arranged in the surface of the substrate 10 between the peripheral impurity region 100a connected in direct current mode to the gate wire 120 and the wire 130 (or the pad) on the nitride film 60.

FIG. 7A is a cross-sectional view taken along a line c—c of FIG. 6, showing a case where the island-shaped floating conducting region 200 is arranged under the wire 130 such that at least a part of the floating conducting region 200 is arranged in the surface of the substrate between the wire 130 on the nitride film 60 and the peripheral impurity region 100a of the gate wire 120 (indicated by a dashed arrow). In a region where the wire 130 is close to the peripheral impurity region 100a of the gate wire 120 for ensuring isolation, leakage of a high frequency signal through the nitride film 60 can be caused. The island-shaped floating conducting region 200 arranged therebetween can therefore block the leakage of a high frequency signal from the wire 130 to the substrate. Suppressing the leakage of a high frequency signal from the wire 130 on the nitride film 60 to the peripheral impurity region 100a of the gate wire 120 as described above results in suppressing the leakage of a high frequency signal from the wire 130 on the nitride film 60 to the gate wire 120 itself. It is therefore possible to prevent the leakage of a high frequency signal, for example, between the drain (source) and the gate.

FIGS. 7B and 7C are cross-sectional views of another patterns correspond to the line c—c of FIG. 6.

As shown in FIG. 7B, the floating conducting region 200 arranged between the wire 130 (or the pad) and the peripheral impurity region 100a in the substrate surface as the another pattern can achieve a similar effect.

FIG. 7C shows a case where the metal layer on the insulating film 60 is a pad (for example, the first output terminal pad O1). When the pad O1 is arranged on the nitride film 60, the pad O1 is often gold-plated as shown in the drawing to absorb a shock during wire-bonding. The metal layer on the insulating film 60 includes a plating metal P1 made of an evaporated metal film and a gold-plated layer P2, but may include only the evaporated metal film P1.

Also in the case where the pad O1 is provided on the nitride film 60, the floating conducting region 200 should be arranged under the pad O1 and in the periphery thereof or arranged only in the periphery thereof. When a high frequency signal is applied to the pad O1, the nitride film 60 serves as a capacitor, and the high frequency signal reaches the substrate. However, the floating conducting region 200 arranged under the pad O1 and in the periphery thereof or arranged only in the periphery of the pad O1 can prevent the leakage of the high frequency signal to the substrate through the nitride film 60.

Under the pad, the peripheral impurity region 100a is provided. This is for the purpose of preventing the leakage of the high frequency signal from the pad O1 to the substrate 10. In other words, the peripheral impurity region 100a has a similar function to that of the floating conducting region 200 under the pad O1. However, in the case of FIG. 7B, the peripheral impurity region 100a is in direct contact with the pad and is connected in direct current mode to the pad. On the other hand, in the case of FIG. 7C, the nitride film 60 is provided between the floating conducting region 200 under the pad O1 and the pad O1. The floating conducting region 200 is therefore not connected in direct current mode to the pad O1. Therefore in the case of FIG. 7C, the floating conducting region 200 is different from the peripheral impurity region 100a.

Next, FIGS. 8A and 8B show cases where the floating conducting region 200 is arranged in the surface of the substrate 10 between the operating region 100c and the wire 130 on the nitride film 60 (indicated by a dashed arrow). FIG. 8A is a cross-sectional view taken along a line d—d of FIG. 6, and FIG. 8B shows another pattern of FIG. 8A.

The operating regions 100c as the conducting regions are arranged on both sides of the wire 130 extending from the common input terminal pad I.

As shown in FIG. 8A, the island-shaped floating conducting region 200 is provided under the wire 130 such that at least a part of the floating conducting region 200 is arranged in the substrate surface between the wire 130 and each of the operating regions 100c. This enables blocking the leakage of a high frequency signal from the wire 130 to the substrate 10.

Moreover, as shown in FIG. 8B, the floating conducting regions 200 arranged in the substrate surface between the wire 130 on the nitride film 60 and the operating regions 100c can achieve a similar effect.

Figure 9A:
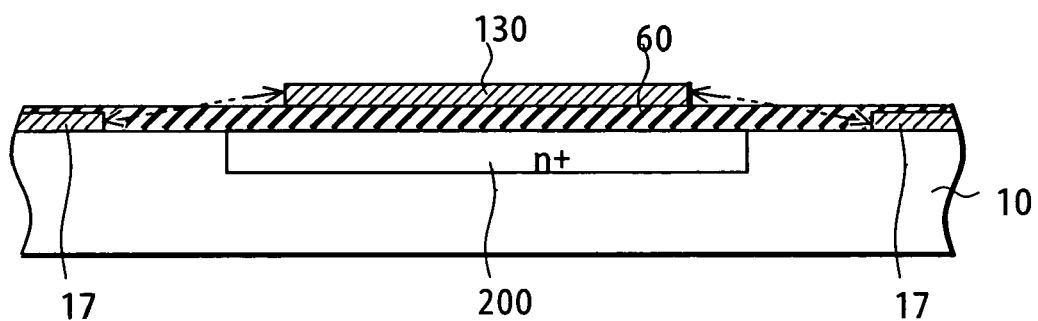
FIGS. 9A and 9B are cross-sectional views of a preferred embodiment of the present invention.
Figure 9B:
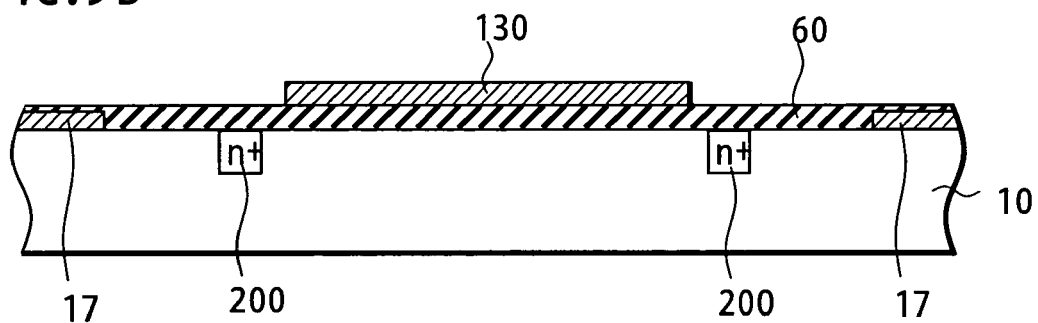

Next, a description is given of the fourth embodiment with reference to FIG. 6 and FIGS. 9A and 9B. In the fourth embodiment, a metal layer on an insulating film is adjacent to another metal layer. And the another metal layer is a gate electrode forming Schottky junction with a substrate. FIG. 9A is a cross-sectional view taken along a line e—e of FIG. 6, and FIG. 9B shows another pattern.

As shown in FIG. 6, in each of the FET1 and the FET2, ends of the teeth of a electrode 17 on the side opposite to the gate wire 120 protrude from the operating region 100c as the conducting region and, as shown in FIG. 9A, form Schottky junction with a semi-insulating substrate including no impurity region formed. Accordingly, in such a region that the gate electrode 17 is close to a wire 130 on a nitride film 60, the leakage of a high frequency signal could be caused.

As shown in FIG. 9A, therefore, a floating conducting region 200 is provided under the wire 130 such that at least a part of the floating conducting region 200 is arranged in the substrate surface between the wire 130 and the each gate electrode 17 (indicated by dashed arrows). This can prevent the leakage of a high frequency signal through a depletion layer expanding in the substrate.

The island-shaped floating conducting regions 200 arranged in the surface of the substrate 10 between the wire 130 and the gate electrodes 17 as shown in FIG. 9B can achieve a similar effect.

Figure 10A:
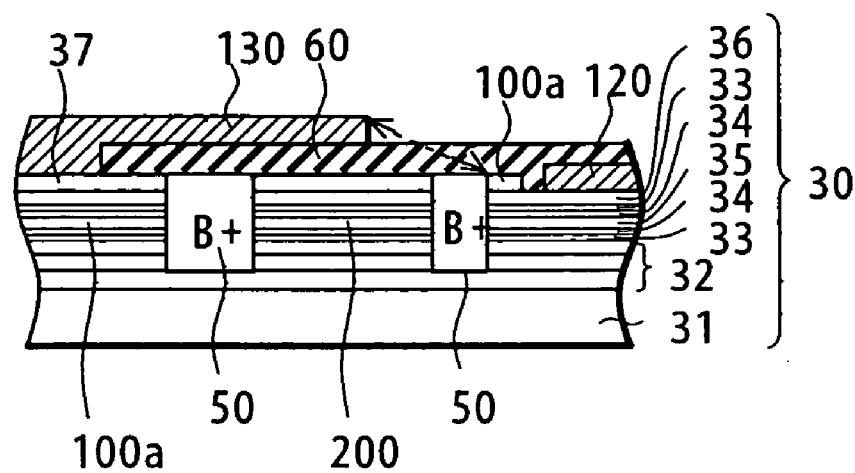
FIGS. 10A and 10B are cross-sectional views of a preferred embodiment of the present invention.

Furthermore, FIGS. 10A to 12B show fifth and sixth embodiments. These embodiments have the same patterns as the third and fourth embodiments, respectively, and the base devices thereof are HEMTs. The description is then given with reference to the plan view of FIG. 6. FIGS. 10A, 11A, and 12A are cross-sectional views taken along lines c—c, d—d, and e—e of FIG. 6, respectively.

As previously described, in the case of the HEMTs, a substrate 30 is isolated by insulating regions 50 to form conducting regions including operating regions 100c, peripheral impurity regions 100a, and resistors 100b.

In the fifth embodiment, a floating conducting region 200 is formed in the substrate 30 between a wire 130 on a nitride film 60 and the peripheral conducting region 100a of a gate wire 120 (indicated by a dashed arrow).

As shown in FIG. 10A, the gate wire 120 (and gate electrodes 17) of the HEMT is vapor-deposited on a portion of a barrier layer 36 which is exposed by etching a cap layer 37. At this time, the cap layer 37 is side-etched by about 0.3 µm after a step of photolithography for forming the gate electrodes 17 and the gate wires 120, and then the gate electrodes 17 and the gate wire 120 are formed.

Specifically, the undoped AlGaAs layer 36 to ensure predetermined breakdown voltage and pinch-off voltage is provided directly under the gate wire 120, and the peripheral conducting region 100a to which the gate wire 120 is connected in a direct current mode is a part of the cap layer 37 arranged in the periphery thereof. In other words, the gate wire 120 is not directly connected to the peripheral impurity region 100a, but the separation of 0.3 µm is small enough to allow a flow of direct current between the gate wire 120 and the peripheral impurity region 100a. That is, the peripheral impurity region 100a is connected in the direct mode to the operating region 100c.

In this embodiment, the floating conducting region 200 is formed by being isolated by insulating regions 50 under the wire 130 such that at least a part of the floating conducting region 200 is arranged in the substrate 30 between the peripheral impurity region 100a connected in direct current mode to the gate wire 120 and the wire 130 on the nitride film 60. In this case, the floating conducting region 200 protrudes from the wire 130 by about 2 µm. It is therefore possible to ensure adequate isolation and reduce the insertion loss.

Suppressing the leakage of a high frequency signal from the wire 130 on the nitride film 60 to the peripheral impurity region 100a of the gate wire 120 as described above results in suppressing the leakage of a high frequency signal from the wire 130 on the nitride film 60 to the gate wire 120 itself. Consequently, the leakage of a high frequency signal between drain (source) and gate of the HEMT, for example, is prevented.

Figure 10B:
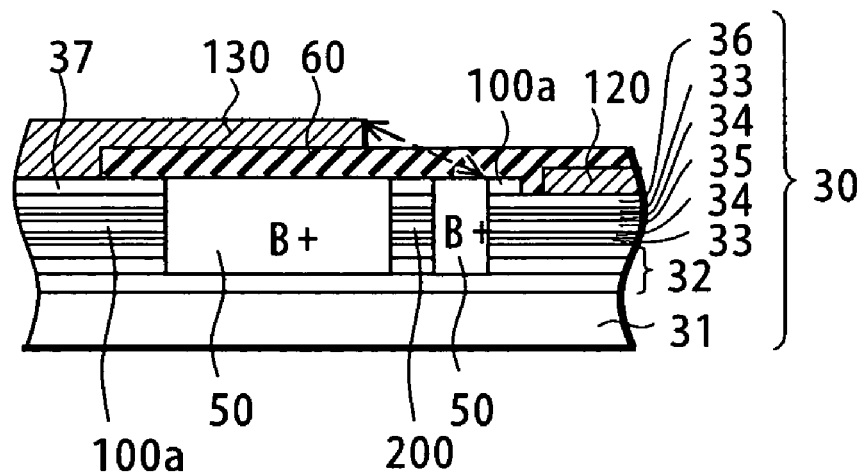

Moreover, as shown in FIG. 10B, the floating conducting region 200 provided in the substrate between the peripheral impurity region 100a and the wire 130 can achieve a similar effect. For example, the floating conducting region 200 with a width of 2 µm is spaced 4 µm apart from the wire 130, and the peripheral impurity region 100a is spaced 4 µm apart from the floating conducting region 200.

Figure 11A:
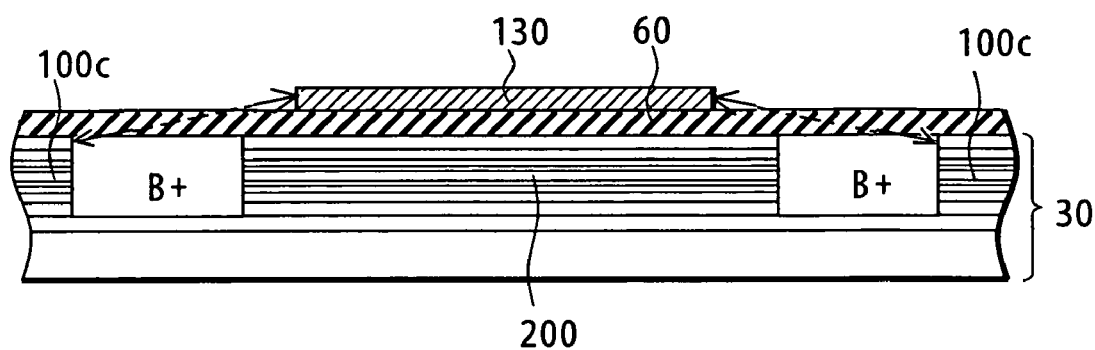
FIGS. 11A and 11B are cross-sectional views of a preferred embodiment of the present invention.
Figure 11B:
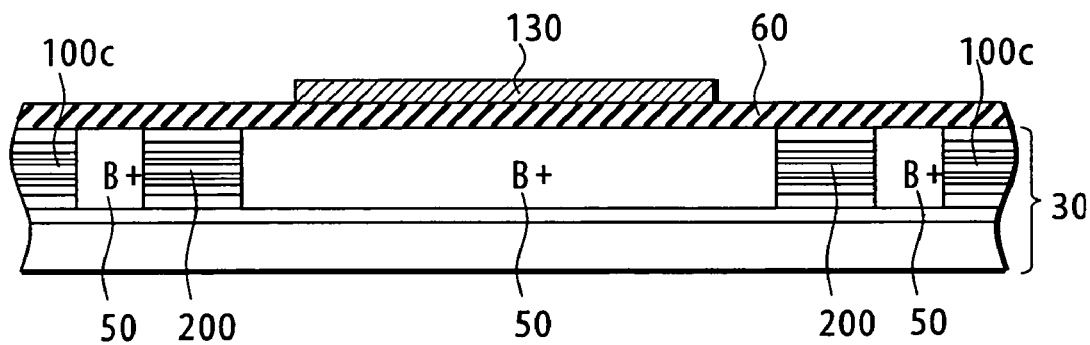

FIGS. 11A and 11B show cases where the floating conducting region 200 is provided in the substrate 30 between the wire 130 and the operating regions 100c.

As shown in FIG. 11A, the island-shaped floating conducting region 200 is provided under the wire 130 such that at least a part of the floating conducting region 200 is arranged in the substrate between each operating region 100c and the wire 130.

As shown in FIG. 11B, the island-shaped floating conducting regions 200 may be arranged between the operating regions 100c and the wire 130.

Figure 12A:
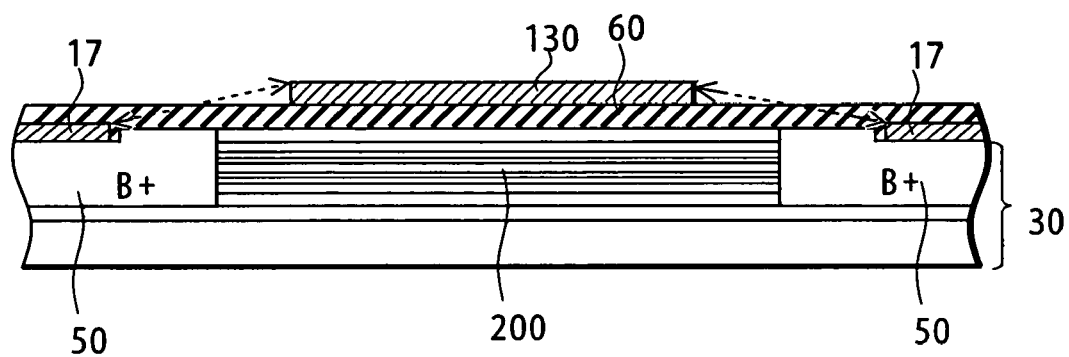
FIGS. 12A and 12B are cross-sectional views of a preferred embodiment of the present invention.
Figure 12B:
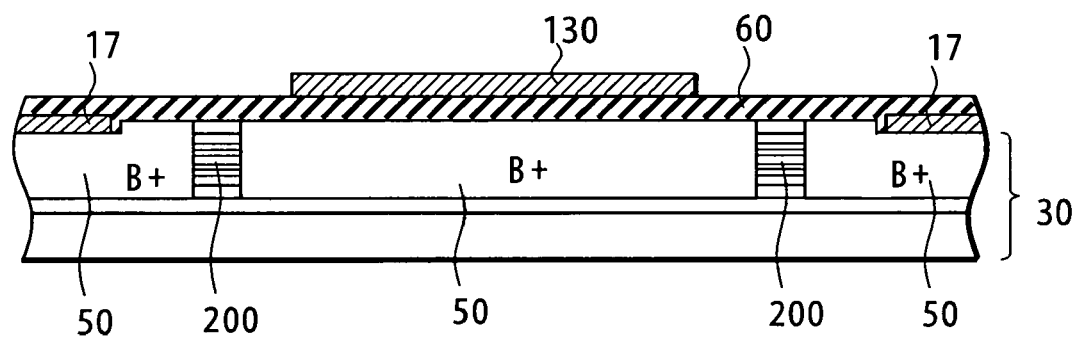

FIGS. 12A and 12B show the sixth embodiment, in which a wire 130 and Schottky metal layers (gate electrodes 17) are adjacent to each other.

In an HEMT substrate 30, insulating regions 50 are arranged in regions other than conducting regions including operating region 100c and peripheral impurity regions 100a or the like. In other words, tip ends of the teeth of the gate electrodes 17 protruding from the operating regions 100c are arranged on the insulating regions 50 and form Schottky junction with the substrate.

The leakage of a high frequency signal could occur also in such a case where the gate electrodes 17 and the wire 130 on the nitride film 60 are adjacent to each other.

As shown in FIG. 12A, an island-shaped floating conducting region 200 is provided under the wire 130 such that at least a part of the floating conducting region 200 is arranged in the substrate 30 between the wire 130 and each gate electrode 17 (indicated by dashed arrows). It is therefore possible to prevent the leakage of a high frequency signal through a depletion layer expanding in the substrate.

Moreover, as shown in FIG. 12B, the floating conducting regions 200 provided in the substrate 30 between the wire 130 and the gate electrodes 17 can achieve a similar effect.

Figure 13:
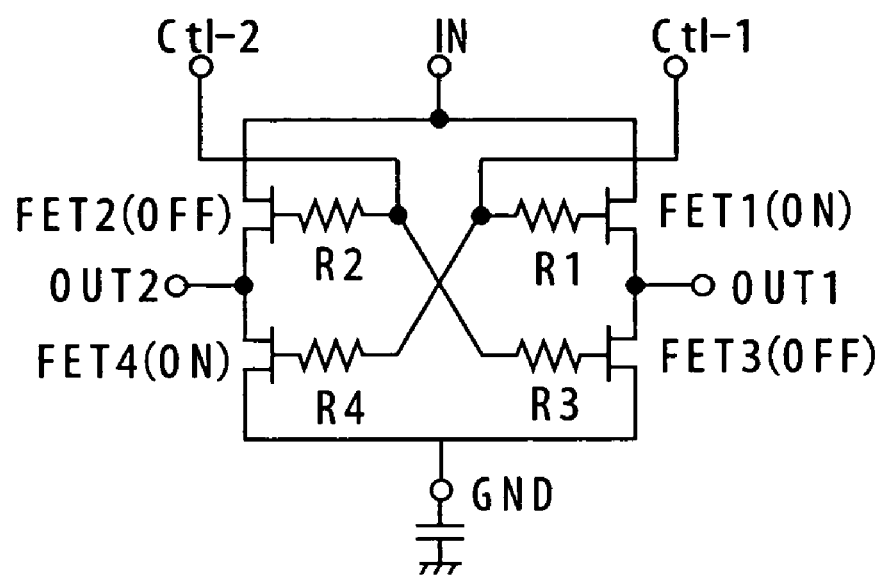
FIG. 13 is a circuit diagram of a preferred embodiment of the present invention.
Figure 14:
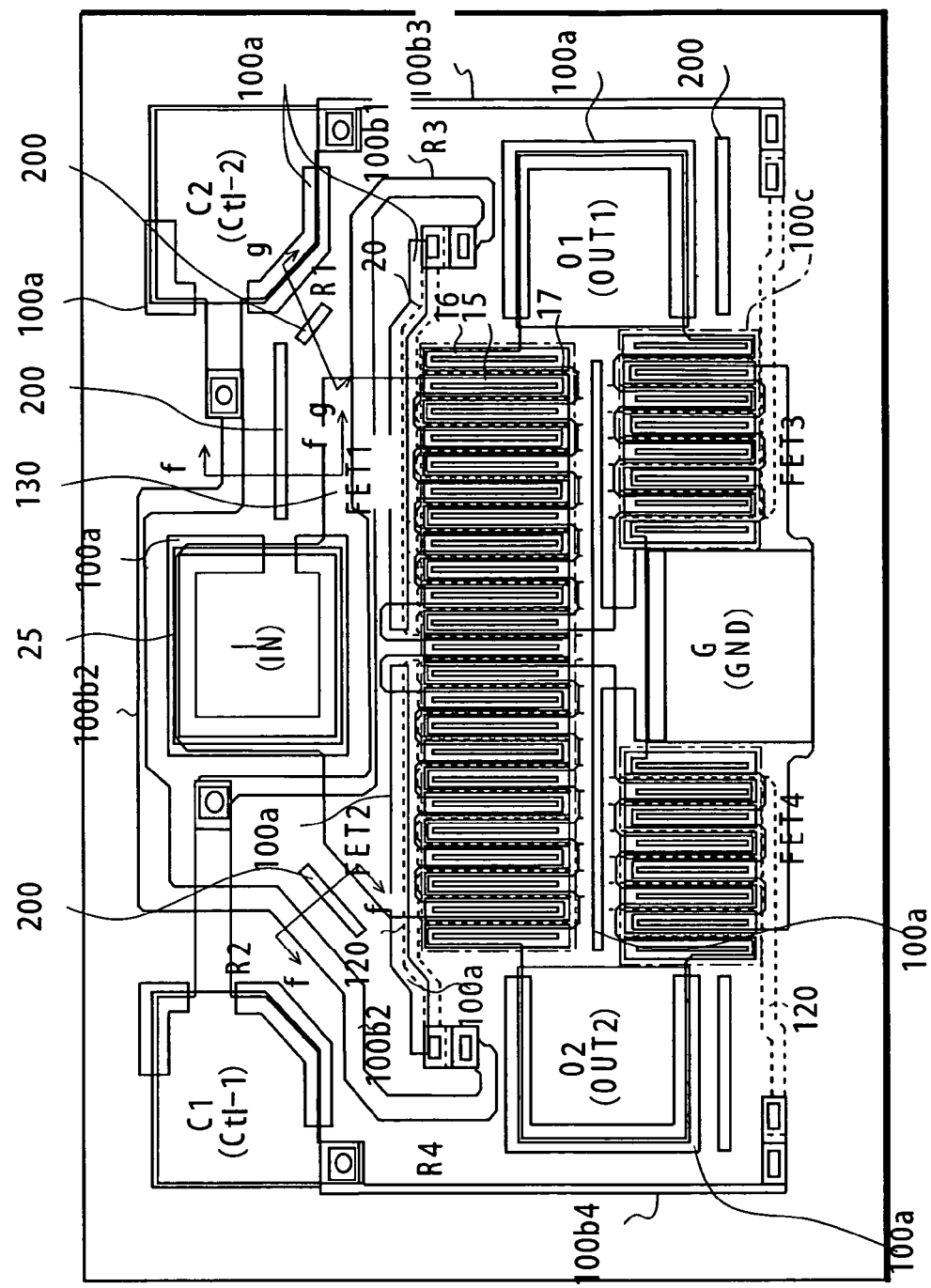
FIG. 14 is a plan view of a preferred embodiment of the present invention.
Figure 15A:
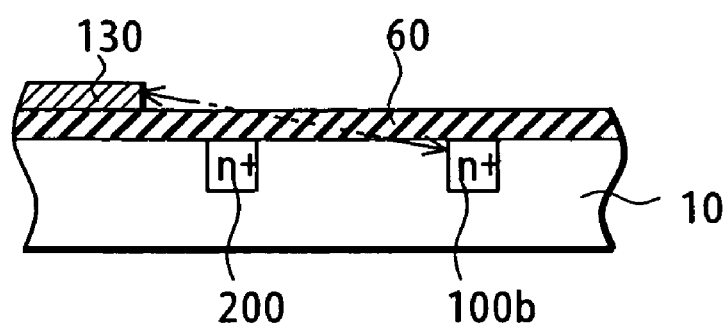
FIGS. 15A and 15B are cross-sectional views of a preferred embodiment of the present invention.
Figure 15B:
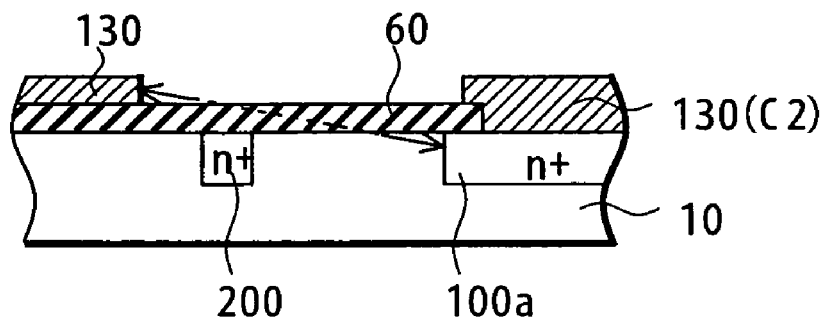

A description is given of another embodiment of the present invention with reference to FIGS. 13 to 15B. This is another embodiment of the SPDT switching circuit device having a control logic pattern layout reverse to the above embodiments. FIG. 13 is a circuit diagram of the switching circuit device, and FIG. 14 is an example of a plan view of a semiconductor device obtained by integrating the circuit shown in FIG. 13. FIGS. 15A and 15B are cross-sectional views taken along lines f—f and g—g of FIG. 14, respectively.

As shown in FIG. 13, in this circuit, shunt FET 3 and FET4 are connected between first and second output terminals OUT1 and OUT2 of FET1 and FET2 for switching and the ground, respectively. Complementary signals of first and second control terminals Ctl-1 and Ctl-2 to the FET1 and FET2 are applied to gates of the shunt FET4 and FET3, respectively. When the FET1 is on, therefore, the shunt FET4 is on and the FET2 and shunt FET3 are off.

In this circuit, when the signal path from a common input terminal IN to the first output terminal OUT1 is turned on and the signal path from the common input terminal IN to the second output terminal OUT2 is turned off, the shunt FET4 is turned on. In other words, leakage from an input signal to the second output terminal OUT2 is leaded to the ground through an external capacitor C grounded, thus improving isolation.

As shown in FIG. 14, the substrate is a compound semiconductor substrate (for example, GaAs substrate). The FET1 and FET2 (gate width: 600 µm) for switching are arranged in the horizontal center of this substrate. The shunt FET3 and FET4 (gate width: 300 µm) are arranged below the FET1 and FET2. Moreover, source electrodes of the shunt FET3 and FET4 are connected to each other and connected to a ground terminal GND. Gate electrodes of the FETs are connected to resistors R1, R2, R3, and R4 respectively. Electrode pads I, O1, O2, C1, C2, and G which correspond to the common input terminal IN, the first and second output terminals OUT1 and OUT2, and the first and second control terminals Ctl-1 and Ctl-2, and the ground terminal GND, respectively, are provided in the periphery of the substrate. The external capacitor C for grounding is connected to the ground terminal GND.

A second metal layer indicated by dotted lines is a gate metal layer (Ti/Pt/Au) 20 formed simultaneously with formation of gate electrodes 17 of the FETs. A third metal layer indicated by solid lines is a pad metal layer (Ti/Pt/Au) 25 for connecting the elements and forming the pads. A first metal layer is an ohmic metal layer (AuGe/Ni/Au) ohmically connected to the substrate and forms source and drain electrodes of each FET and extraction electrodes at both ends of the resistors. The ohmic layer is overlapped by the pad metal layer and 25 is not shown in the drawing.

The operating regions 100c of the FETs are conducting regions formed in regions indicated by dashed-dotted lines. In the FET1 (similar in the FET2), a source electrode 15 (or a drain electrode 16) includes six comb teeth of the pad metal layer 25, the teeth extending from the lower side, and is connected to the first output terminal pad O1. The source electrode (or the drain electrode) formed of the ohmic metal layer is provided thereunder and ohmically connected to a source region (a drain region) of the operating region 100c.

The drain electrode 16 (or the source electrode 15) includes six comb teeth of the pad metal layer 25, the teeth extending from the upper side, and is connected to the common input terminal pad I. The drain electrode (or the source electrode) formed of the ohmic metal layer is provided thereunder and ohmically connected to the drain region (the source region) of the operating region 100c. Note that a central comb tooth of the drain electrode 16 (or the source electrode 15), the tooth extending from the common input terminal pad I is common to the FET1 and FET2. These source and drain electrodes 15 and 16 are arranged in a form of engaged combs. The gate electrode 17 formed of the gate metal layer 20 includes comb teeth arranged between pairs of adjacent teeth of the drain and source electrodes 16 and 15 and forms Schottky junction with a part of the operating regions 100c.

In the FET3 (similar in the FET4) as a shunt FET, the source electrode 15 (or the drain electrode 16) includes four comb teeth of the pad metal layer 25, the teeth extending from the lower side, and is connected to the ground terminal pad G. The source electrode (the drain electrode) formed of the ohmic metal layer is provided thereunder and ohmically connected to the source (drain) region of the operating region 100c.

The drain electrode 16 (the source electrode 15) includes four comb teeth of the pad metal layer 25, the teeth extending from the upper side, and is connected to the first output terminal pad 01. The drain electrode (the source electrode) formed of the ohmic metal layer is provided thereunder and ohmically connected to the drain (source) region of the operating region 100c. The source and drain electrodes 15 and 16 are arranged in a form of engaged combs. The gate electrode 17 formed of the gate metal layer 20 includes comb teeth each arranged between pairs of adjacent teeth of the drain and source electrodes 16 and 15 and forms Schottky junction with the operating regions 100c.

In a pattern shown in the drawing, a part of a peripheral impurity region 100a of the GND terminal pad G is extended between the FET1 and FET2 for switching and the FET3 and FET4, which are shunt FETs and placed opposite to each other. This prevents a depletion layer expanding in the substrate from the gate electrodes of the FET1 and FET2, which form Schottky junction with the substrate outside the operating regions 100c, from reaching the gate electrodes, source, and drain regions and the operating regions 100c of the FET3 and FET4, which are placed adjacent and opposite to each other.

The teeth of the gate electrode 17 of each FET are joined to each other with a gate wire 120 outside the operating region 100c and connected to any one of the first and second control terminal pads C1 and C2 through any one of resistors 100b1 to 100b4, which are conducting regions. The peripheral impurity regions 100a are connected in direct current mode to each of the pads (I, O1, O2, C1 and C2) or gate wires 120 and connected in direct current mode to the operating region 100c.

As shown in FIG. 15A, the island-shaped floating conducting region 200 is arranged in the substrate between the wire 130 on a nitride film 60 and the resistor 100b1 (100b2) (indicated by a dashed arrow).

As shown in FIG. 15B, the island-shaped floating conducting region 200 is arranged in the substrate between the wire 130 on the nitride film and the peripheral impurity region 100a of the second control terminal pad C2 (indicated by a dashed arrow).

In the case where the base device is an HEMT, the conducting regions including the floating conducting regions 200 are isolated by the insulating regions 50. This can prevent the leakage of a high frequency signal in regions where the wire 130 on the insulating film 60 is close to the resistor 100b or to the peripheral regions 100a of the pads.

In FIGS. 15A and 15B, the description was given with the case of the GaAs FET as an example, but, as shown in FIGS. 10A to 12B, this embodiment can be implemented in the case of an HEMT as well.

In terms of the resistors, in the case of the GaAs FET, it is possible to mix resistors with different sheet resistances due to different ions implantation conditions including dose amount and accelerating voltage, and in the case of the HEMT, it is possible to mix resistors with and without the cap layer. Any of the resistors is a conducting region connected to an operating region. When these resistors are close to a wire on an insulating film, the floating conducting region is arranged in the substrate, thus improving the isolation of a high frequency signal.

Moreover, in terms of the epitaxial structure of the HEMT, these embodiments can be implemented with an epitaxial structure further including repetition of AlGaAs and GaAs layers or including an InGaP layer between a cap layer 37 and a barrier layer 36.

According to the embodiments of the present invention, the following effects can be obtained.

First, the high concentration impurity region at floating potential is provided in the surface of the substrate in the region where the metal layer is adjacent to another metal layer on the insulating film which are connected to the operating region and/or the region where the metal layer on the insulating film which is connected to the operating region is adjacent to the conducting region. This can suppress extension of the depletion layer in the substrate from the metal layer on the insulating film to the substrate and prevent leakage of a high frequency signal.

Secondly, the metal layer on the insulating film is a wire or a pad, and the island-shaped conducting region at floating potential is arranged in the surface of the substrate between the wire or pad and another metal layer and/or between the wire or pad and each conducting region. This can prevent leakage of a high frequency signal in the regions where the wire or pad arranged on the substrate with the insulating film interposed therebetween is adjacent to the metal layers and conducting regions constituting the semiconductor device.

Thirdly, the conducting region at floating potential arranged in the substrate between the metal layers arranged on the insulating film can prevent the leakage of a high frequency signal in the region where the metal layers are close to each other on the insulating film.

Fourthly, the conducting region at floating potential provided in the substrate between the Schottky metal layer and the metal layer provided on the insulating film can prevent the leakage of a high frequency signal therebetween.

Fifthly, the conducting region at floating potential is provided in the substrate between the wire or pad connected to the operating region of a switching circuit with the insulating film interposed therebetween and both or one of another metal layer and conducting region constituting the switching circuit. It is therefore possible to block the depletion layer expanding in the substrate because of the high frequency signal transmitted in the wire or pad and thereby suppress the leakage of a high frequency signal from the wire or pad to the adjacent metal layer and/or conducting region. In a switching circuit device including the components arranged close to each other because of reduction in size of the chip, in particular, the leakage of a high frequency signal between the wire or pad and another component can be prevented, thus improving isolation and preventing an increase in insertion loss.

Sixthly, the conducting region at floating potential provided in the substrate between the wire or pad provided on the insulating film and another metal layer connected to the operating region can suppress the leakage of a high frequency signal between the metal layers close to each other.

Seventhly, the conducting region at floating potential provided in the substrate between the gate electrode or gate wire forming Schottky junction with the substrate and the wire or pad on the nitride film can suppress the leakage of a high frequency signal in the region where the wire or pad is close to the gate wire (or the gate electrode).

Eighthly, in the case where the switching circuit is composed of an HEMT, the insertion loss of the base device is small. In other words, small leakage of a high frequency signal in a place other than the base device leads to an increase in insertion loss of the entire switching circuit. This is almost completely prevented in the embodiment of the present invention to form an MMIC sufficiently utilizing an advantage of the low insertion loss property of the HEMT.

Ninthly, the leakage of a high frequency signal can be prevented between the conducting region and the wire or pad arranged with the insulating film interposed therebetween. The above conducting region is any one of the operating region constituting the semiconductor device, the peripheral impurity region for ensuring isolation of the pad (or the gate wire), and the resistor.

Tenthly, when a high frequency analogue signal is transmitted in the wire or pad, in particular, the insulating film serves as a capacitor, and a depletion layer due to the high frequency signal expands in the substrate. However, according to the embodiment of the present invention, the expansion of the depletion layer can be effectively prevented, thus improving the isolation of the semiconductor device and suppressing the increase in insertion loss.

What is claimed is:

1. A semiconductor device comprising:
a compound semiconductor substrate;
an insulating film disposed on the substrate;
a metal layer disposed on the insulating film;
a conducting portion disposed in or on the substrate; and
a floating conducting region disposed in or on the substrate, the floating conducting region being configured not to receive any electric potential and having an impurity concentration of an n-type impurity from $1 \times 10^{18}$ atoms cm$^{-3}$ to $5 \times 10^{18}$ atoms cm$^{-3}$, and at least part of the floating conducting region being disposed between the metal layer and the conducting portion.

2. A semiconductor device comprising:
a compound semiconductor substrate;
an operating region disposed in the substrate;
an insulating film disposed on the substrate;
a metal layer disposed on the insulating film and connected to the operating region; and
a floating conducting region disposed in the substrate, configured not to receive any electric potential and having an impurity concentration of an n-type impurity from $1 \times 10^{18}$ atoms cm$^{-3}$ to $5 \times 10^{18}$ atoms cm$^{-3}$,
wherein at least part of the floating conducting region is disposed between the metal layer and a member selected from the group consisting of the operating region, another metal layer disposed on the substrate and connected with the operating region to allow a direct current flow between the operating region and the another metal layer, and a conducting region disposed in the substrate and connected with the operating region or disposed in a close proximity of the operating region to allow a direct current flow between the operating region and the conducting region.

3. The semiconductor device of claim 2, wherein the part of the floating conducting region is disposed between the metal layer and the conducting region that is part of an impurity region that is disposed at a periphery of an electrode pad, or a wiring line connected to the electrode pad.

4. The semiconductor device of claim 2, wherein the metal layer comprises a pad or a wiring line.

5. The semiconductor device of claim 2, wherein the part of the floating conducting region is disposed between the metal layer and the another metal layer that is disposed on the insulating film.

6. The semiconductor device of claim 2, wherein the part of the floating conducting region is disposed between the metal layer and the another metal layer that forms a Schottky junction with the substrate.

7. A semiconductor device comprising:
a compound semiconductor substrate;
a stack of semiconductor layers disposed on the substrate;
an operating region disposed in the stack;
an insulating film disposed on the stack;
a metal layer disposed on the insulating film and connected to the operating region; and
a floating conducting region disposed in the stack, configured not to receive any electric potential and having an impurity concentration of an n-type impurity from $1 \times 10^{18}$ atoms cm$^{-3}$ to $5 \times 10^{18}$ atoms cm$^{-3}$,
wherein at least part of the floating conducting region is disposed between the metal layer and a member selected from the group consisting of the operating region, another metal layer disposed in or on the stack and connected with the operating region to allow a direct current flow between the operating region and the another metal layer, and a conducting region disposed in the stack and connected with the operating region to allow a direct current flow between the operating region and the conducting region.

8. The semiconductor device of claim 7, wherein the metal layer comprises a pad or a wiring line.

9. The semiconductor device of claim 7, wherein the part of the floating conducting region is disposed between the metal layer and the another metal layer that is disposed on the insulating film.

10. The semiconductor device of claim 7, wherein the part of the floating conducting region is disposed between the metal layer and the another metal layer that forms a Schottky junction with the substrate.

11. The semiconductor device of claim 7, wherein the part of the floating conducting region is disposed between the metal layer and the conducting region that is disposed at a periphery of an electrode pad, or a wiring line connected to the electrode pad.

12. A semiconductor device comprising:
- a compound semiconductor substrate;
- a first field effect transistor and a second field effect transistor, each of the transistors being formed on the substrate and comprising an operating region disposed in the substrate and a gate electrode, a source electrode and a drain electrode that are connected with the operating region;
- a common input terminal pad connected with the source or drain electrode of the first transistor and connected with the source or drain electrode of the second transistor;
- a first output terminal pad connected with the source or drain electrode of the first transistor that is not connected with the common input terminal pad;
- a second output terminal pad connected with the source or drain electrode of the second transistor that is not connected with the common input terminal pad;
- a first control terminal pad;
- a first electric connection connecting the first control terminal pad and the gate electrode of the first transistor;
- a second control terminal pad;
- a second electric connection connecting the second control terminal pad and the gate electrode of the second transistor;
- an insulating film disposed on the substrate;
- a metal layer disposed on the insulating film and connected to the operation region of the first or second transistor;
- a floating conducting region disposed in the substrate, configured not to receive any electric potential and having an impurity concentration of an n-type impurity from $1\times10^{18}$ atoms cm$^{-3}$ to $5\times10^{18}$ atoms cm$^{-3}$,
- wherein at least part of the floating conducting region is disposed between the metal layer and a member selected from the group consisting of the operating region of the first transistor, the operating region of the second transistor, another metal layer disposed on the substrate and connected with the operating region of the first or second transistor to allow a direct current flow between the operating region and the another metal layer, and a conducting region disposed in the substrate and connected with the operating region of the first or second transistor to allow a direct current flow between the operating region and the conducting region.

13. The semiconductor device of claim 12, wherein the metal layer is part of one of the pads or a wiring line connected to one of the pads.

14. The semiconductor device of claim 12, wherein the part of the floating conducting region is disposed between the metal layer and the another metal layer that is disposed on the insulating film.

15. The semiconductor device of claim 12, wherein the part of the floating conducting region is disposed between the metal layer and the another metal layer that is part of the gate electrode or a wiring line connected to the gate electrode.

16. The semiconductor device of claim 12, wherein the part of the floating conducting region is disposed between the metal layer and the conducting region that is part of an impurity region that is disposed at a periphery of one of the pads, a wiring line connected to one of the pads, the first electric connection or the second electric connection.

17. The semiconductor device of claim 12, wherein the metal layer is configured to transmit a high frequency analog signal.

18. A semiconductor device comprising:
- a compound semiconductor substrate;
- a first field effect transistor and a second field effect transistor, each of the transistors being formed on the substrate and comprising an operating region disposed in a stack of semiconductor layers disposed on the substrate and a gate electrode, a source electrode and a drain electrode that are connected with the operating region;
- a common input terminal pad connected with the source or drain electrode of the first transistor and connected with the source or drain electrode of the second transistor;
- a first output terminal pad connected with the source or drain electrode of the first transistor that is not connected with the common input terminal pad;
- a second output terminal pad connected with the source or drain electrode of the second transistor that is not connected with the common input terminal pad;
- a first control terminal pad;
- a first electric connection connecting the first control terminal pad and the gate electrode of the first transistor;
- a second control terminal pad;
- a second electric connection connecting the second control terminal pad and the gate electrode of the second transistor;
- an insulating film disposed on the stack;
- a metal layer disposed on the insulating film and connected to the operation region of the first or second transistor;
- a floating conducting region disposed in the stack, configured not to receive any electric potential and having an impurity concentration of an n-type impurity from $1\times10^{18}$ atoms cm$^{-3}$ $5\times10^{18}$ atoms cm$^{-3}$,
- wherein at least part of the floating conducting region is disposed between the metal layer and a member selected from the group consisting of the operating region of the first transistor, the operating region of the second transistor, another metal layer disposed in or on the stack and connected with the operating region of the first or second transistor to allow a direct current flow between the operating region and the another metal layer, and a conducting region disposed in the stack and connected with the operating region of the first or second transistor to allow a direct current flow between the operating region and the conducting region.

19. The semiconductor device of claim 18, wherein the metal layer is part of one of the pads or a wiring line connected to one of the pads.

20. The semiconductor device of claim 18, wherein the part of the floating conducting region is disposed between the metal layer and the another metal layer that is disposed on the insulating film.

21. The semiconductor device of claim 18, wherein the part of the floating conducting region is disposed between the metal layer and the another metal layer that is part of the gate electrode or a wiring line connected to the gate electrode.

22. The semiconductor device of claim 18, wherein the part of the floating conducting region is disposed between the metal layer and the conducting region that is part of an impurity region that is disposed at a periphery of one of the pads, a wiring line connected to one of the pads, the first electric connection or the second electric connection.

23. The semiconductor device of claim 18, wherein the metal layer is configured to transmit a high frequency analog signal.

24. The semiconductor device of claim 1, wherein the insulating film is formed directly on the substrate.

* * * * *